(12) United States Patent
Grützediek et al.

(10) Patent No.: US 7,563,685 B2
(45) Date of Patent: Jul. 21, 2009

(54) BIPOLAR-TRANSISTOR AND METHOD FOR THE PRODUCTION OF A BIPOLAR-TRANSISTOR

(75) Inventors: Hartmut Grützediek, Mainz (DE); Michael Rammensee, Mainz (DE); Joachim Scheerer, Mainz (DE)

(73) Assignee: Prema-Semiconductor GmbH, Mainz (DE)

( * ) Notice: Subject to any disclaimer, the term of this patent is extended or adjusted under 35 U.S.C. 154(b) by 67 days.

(21) Appl. No.: 11/547,532

(22) PCT Filed: Mar. 24, 2005

(86) PCT No.: PCT/EP2005/003129
§ 371 (c)(1),
(2), (4) Date: Sep. 29, 2006

(87) PCT Pub. No.: WO2005/098960
PCT Pub. Date: Oct. 20, 2005

(65) Prior Publication Data
US 2007/0273007 A1 Nov. 29, 2007

(30) Foreign Application Priority Data
Apr. 2, 2004 (DE) .................. 10 2004 016 992

(51) Int. Cl.
*H01L 21/331* (2006.01)
(52) U.S. Cl. .................. 438/370; 438/309; 438/369; 257/409; 257/565
(58) Field of Classification Search .................. 438/309, 438/369, 370, 372; 257/409, 565, 577, 583
See application file for complete search history.

(56) References Cited

U.S. PATENT DOCUMENTS 4,639,761 A 1/1987 Singer et al.

(Continued)

FOREIGN PATENT DOCUMENTS

| DE | 10036007 A1 | 2/2002 |
| EP | 1168452 A2 | 1/2002 |
| EP | 1198007 A | 4/2002 |
| WO | WO 00/19503 | 4/2000 |

OTHER PUBLICATIONS

Bashir, R., et al., "A Complementary Bipolar Technology Family With a Vertically Integrated PMP for High-Frequency Analog Applications," *IEEE Transactions on Electronic Devices*, vol. 48, No. 11, pp. 2525-2534 (Nov. 2001).

*Primary Examiner*—Phuc T Dang
(74) *Attorney, Agent, or Firm*—Hamilton, Brook, Smith & Reynolds, P.C.

(57) ABSTRACT

The invention relates to NPN and PNP bipolar transistors and to a method for the production thereof, said transistors being characterised by a particularly high collector-emitter and collector-base blocking voltage. The blocking voltage is increased by a particular doping profile. An NPN bipolar transistor comprises a p-doped substrate (1), a trenched n-doped layer (3) forming the collector, a p-doped layer (7) which is arranged above the trenched n-doped layer and is made of a base and an n-doped layer which is arranged within the p-doped layer and forms an emitter of the transistor. A spatial charge area (RLZ 1) is formed between the p-doped layer and the trenched n-doped layer and a second spatial charge area (RLZ 2) is formed between the trenched n-doped layer and the p-doped substrate, which expands in the vertical direction on the collector when the transistor is operated with an increasing potential. The trenched n-doped layer comprises a doping profile in such a manner that when the transistor is operated with an increasing potential, the first and the second spatial charge area expand on the collector, transversing the entire depth of the trenched n-doped layer prior to the critical field strength for a breakthrough being reached between the collector and emitter.

3 Claims, 10 Drawing Sheets

U.S. PATENT DOCUMENTS

| | | |
|---|---|---|
| 5,837,590 A | 11/1998 | Latham et al. |
| 6,538,294 B1 * | 3/2003 | Sjodin et al. ................ 257/409 |
| 6,894,367 B2 * | 5/2005 | Nelle et al. ................ 257/577 |
| 2001/0017379 A1 | 8/2001 | Tsai et al. |
| 2002/0105054 A1 | 8/2002 | Tsai et al. |
| 2003/0030127 A1 | 2/2003 | Huizing et al. |
| 2005/0145905 A1 * | 7/2005 | Iwata ........................ 257/292 |

* cited by examiner

NPN in the P-type substrate

Implantation of the buried layer

Fig. 1a

Terminal implantation

Fig. 1b

P-type base implantation

Fig. 1c

N+ implantation

Fig. 1d

NPN in the P-type substrate

PNP in the P-type substrate

Implantation of the buried layer

PNP in the P-type substrate

PNP in the N-type substrate

Implantation of the buried layer

Fig. 7a

Terminal implantation

Fig. 7b

N-type base implantation

Fig. 7c

P+ implantation

Fig. 7d

PNP in the N-type substrate

NPN in the N-type substrate

NPN in the N-type substrate

BIPOLAR-TRANSISTOR AND METHOD FOR THE PRODUCTION OF A BIPOLAR-TRANSISTOR

RELATED APPLICATIONS

This application is the U.S. National Stage of International Application No. PCT/EP2005/003129, filed Mar. 24, 2005, published in German, and claims priority under 35 U.S.C. § 119 or 365 to German Application No. 10 2004 016 992.6, filed Apr. 2, 2004.

FIELD OF INVENTION

The invention relates to an integral NPN bipolar transistor and a PNP bipolar transistor and to a method for the production thereof.

BACKGROUND

Bipolar transistors are generally known as semiconductor components. A brief overview of the diverse methods for the production of bipolar transistors is given in the journal article "Advances in Bipolar VLSI" by George R. Wilson in Proceedings of the IEEE, Vol. 78, No. 11, 1990, pp. 1707 to 1719.

A standard process for the production of bipolar transistors is described in more detail below. Firstly, a subcollector zone, also referred to as a buried layer, is indiffused into a p-doped semiconductor substrate, by means of which zone the collector bulk resistance of the transistor can be effectively reduced. The semiconductor substrate is subsequently coated with an epitaxial n-conducting layer. Electrically insulated regions are then separated off in the epitaxial layer. These so-called epitaxial islands are isolated by means of reverse-biased pn junctions created by deeply indiffused p-type zones. This is followed by further diffusion steps used to define the base and emitter regions of the NPN bipolar transistor. The contact connection for the transistor terminals is subsequently performed.

DE 198 44 531 A1 describes a simplified method for the production of semiconductor components, in particular bipolar transistors, in which an epitaxy and isolation process as in the standard bipolar process is no longer required. The simplified method is distinguished by the fact that a mask is applied to the semiconductor substrate, which mask defines a window delimited by a circumferential edge, and an n-doped or p-doped well is produced by means of high-voltage ion implantation in the semiconductor substrate. The high-voltage ion implantation is effected with an energy high enough such that a p-doped or n-doped inner zone remains at the surface of the semiconductor substrate, while the edge zone of the n-doped or p-doped well reaches as far as the surface of the substrate. Proceeding from this semiconductor structure, it is possible to produce both NPN and PNP transistors. DE 198 44 531 A1 proposes an implantation of phosphorus ions with an implantation energy of 6 MeV.

Conventional integrated bipolar transistors are vertical transistors, that is to say that the collector-emitter current flows perpendicular to the wafer surface. Since the lateral dimensions are usually much greater than the vertical dimensions, the transistor can initially be reduced to a one-dimensional component. In the turned-off transistor, the applied voltage is dropped across the collector-base depletion layer. It must therefore be designed for the highest possible breakdown voltages. The field lines are likewise oriented perpendicular to the wafer surface. Under an applied reverse voltage, the majority charge carriers are withdrawn on both sides of the pn junction, which gives rise to a zone that is depleted of mobile charge carriers (depletion zone). The stationary negatively charged acceptors and the likewise stationary positively charged donors remain in said zone, so that a space charge arises which builds up an electric field. Therefore, the depletion zone is also called space charge zone. As the reverse voltage increases, the space charge rises on both sides of the pn junction, and thus the field strength rises as well. The local field strength E(x) is obtained by integration of the space charge from an edge $x_1$ of the space charge zone to the depth x divided by the dielectric constant.

$$E(x) = \int_{x_1}^{x} \frac{q \cdot [N_D(x') - N_A(x')]}{\varepsilon_0 - \varepsilon_{Si}} dx' \quad (1)$$

Since the space charge zone is depleted of majority charge carriers, the space charge results from the product of the elementary charge q and the difference between the (volume) concentrations of the donors $N_D$ and the acceptors $N_A$. The negatively charged acceptors are predominant on the p-doped side and the positively charged donors are predominant on the n-doped side. Owing to the neutrality condition, the charges on both sides of the pn junction must be identical in terms of magnitude.

The voltage V present at the pn junction is obtained by the integration of the field strength over the space charge zone.

$$V := \int_{x_1}^{x_2} E(x') dx' \quad (2)$$

In this case, the integration limits $x_1$ and $x_2$ correspond to the edges of the space charge zone.

An avalanche breakdown takes place starting from a specific material- and doping-dependent field strength $E_{DB}$, which is between 150-1000 kV/cm in the case of silicon. In order to achieve a high reverse voltage without exceeding the breakdown field strength $E_{DB}$, a specific minimum depth and a suitable doping profile for the collector are required. In conventional transistors, the breakdown voltage between base and collector $U_{CB0}$ is limited by the depth of the collector doping and the doping profile thereof. Since dopings several micrometers deep are not only complicated to produce and difficult to connect from the surface but also lead laterally to large structures and thus require much valuable chip area, integrated bipolar transistors have only a very limited dielectric strength. This circumstance is exacerbated by the fact that with an open base, a collector-emitter breakdown ($U_{CE0}$ breakdown) already takes place at a significantly lower voltage $U_{CE0}$ ($<<U_{CB0}$). It results from the fact that in regions having sufficiently high field strength thermally generated charge carriers are accelerated to a such a great extent that they have enough energy to generate further electron-hole pairs by knocking out further electrons from the bonds above the Si crystal (multiplication effect). If this happens in the space charge zone of the collector-base junction directly below the emitter-base junction, then it is possible, in the case of an NPN transistor, for the holes generated to flow away via the base into the emitter and act like a base current in-this case. The latter is re-emitted in the emitter as an electron current increased by the current gain B, which current, for its part, flows into the collector, where it is amplified again by the multiplication effect. The $U_{CE0}$ breakdown thus arises as a result of a positive feedback.

The relationship between $U_{CE0}$, $U_{CB0}$ and current gain B can be described by the following equation:

$$U_{CB0} := \frac{U_{CB0}}{\sqrt[n]{B+1}} \quad (3)$$

The indications for the empirical parameter n read variously:

n=4
n=4 for NPN transistors and n=2 for PNP transistors
n=4 for NPN transistors and n=6 for PNP transistors
n=4 for n-type silicon and n=2 for p-type silicon or overall n=3 . . . 6.

With the most frequently mentioned value of n=4 and a typical current gain of B=100, $U_{CE0} \approx \frac{1}{3} * U_{CB0}$ is obtained. As the collector current increases, the breakdown voltage even decreases somewhat, so that the reliable operating range of a bipolar transistor generally extends only to approximately 5 V below $U_{CE0}$.

SUMMARY

The invention is based on the object of providing bipolar transistors having a high collector-emitter reverse voltage with an open base $U_{CE0}$ and a high collector-base reverse voltage $U_{CB0}$, and of specifying a method for the production thereof.

The basic principle of the transistors according to the invention and of the method according to the invention lies in the relatively low doping concentration of the buried layer. The implantation dose lies within a range lying far below the implantation dose in the known methods.

It has surprisingly been shown that when lowering the implantation dose for the buried layer, the collector-emitter reverse voltage $U_{CE0}$ suddenly rises greatly. Only the collector-substrate breakdown and the punch-through breakdown between base and substrate then determine the maximum operating voltage of the transistor.

The principle of the voltage-stable NPN bipolar transistor can also be applied to PNP transistors with the same technology.

BRIEF DESCRIPTION OF THE DRAWINGS

Various exemplary embodiments of the invention are explained in more detail below with reference to the drawings.

In the figures.

DETAILED DESCRIPTION

Firstly a description is given of the method steps for the production of an NPN bipolar transistor and a PNP bipolar transistor in a p-doped substrate.

Figure 1A:
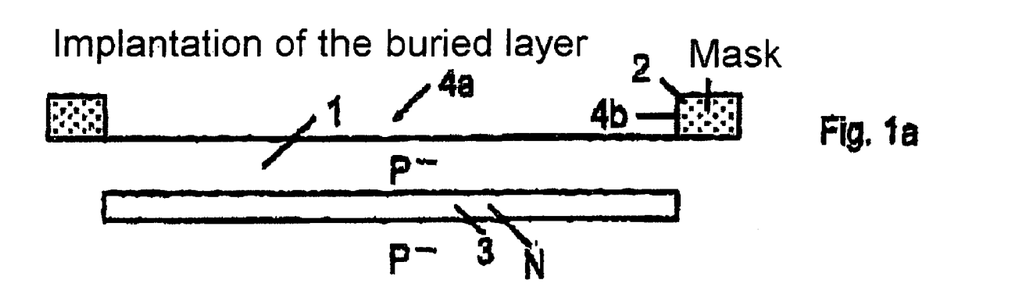
FIGS. 1a-1g show the method steps for the production of an NPN transistor in a p-doped semiconductor substrate.

A mask 2 is applied to a weakly p-doped semiconductor substrate 1 (wafer), said mask having a window 4a delimited by a circumferential edge 4b. A wafer made of weakly doped monocrystalline silicon having a resistance of approximately 6 Ωcm, which corresponds to a basic doping of approximately $2.3 \times 10^{15}$ cm$^{-3}$, is preferably used for the basic material. The mask material may comprise photoresist, metal, glass or else other materials. The structure is preferably produced by photolithographic methods. A new mask is in each case applied between the individual implantation steps. This is also known to the person skilled in the art.

Mask production by means of the known processes is followed by a doping, preferably an implantation of phosphorus ions with an implantation dose which, depending on the substrate doping, lies between $5 \times 10^{11}$ atoms/cm$^{-2}$ and $5 \times 10^{12}$ atoms/cm$^{-2}$. In the present exemplary embodiment, the dose is $1.7 \times 10^{12}$ atoms/cm$^{-2}$ and the implantation energy is 6 MeV. A buried n-doped layer 3 is thereby produced in the p-type substrate 1, said layer forming the collector K of the transistor. The buried layer is also referred to as a well (FIG. 1a).

The doping concentration falls proceeding from a maximum from the average range of the ions not only into the depth of the substrate but also the wafer surface. In contrast to indiffused wells, this is referred to as an n-type well with a "retrograde" profile. Given a sufficiently deep ion implantation or a sufficiently high basic or substrate doping, the substrate doping is maintained at the wafer surface. However, this is not absolutely necessary when producing an NPN transistor in the p-type substrate.

Figure 1B:
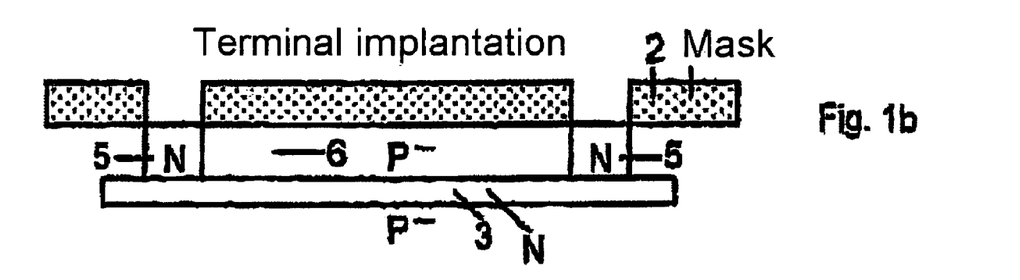

For lateral isolation and as the terminal of the collector K, an annular n-doped layer 5 is introduced by implantation or diffusion into the p-type substrate 1, said layer extending as far as the buried n-doped layer 3. However, the lateral isolation may for example also be effected by etching a trench. This procedure is known to the person skilled in the art (FIG. 1b).

Figure 1C:
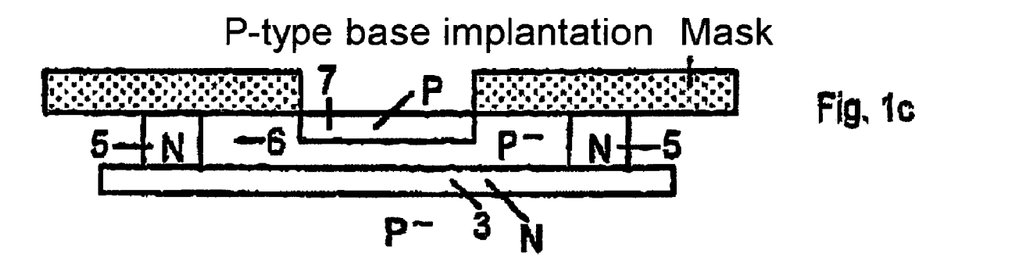

By means of ion implantation, a central, for example rectangular or round p-doped layer 7 with a customary concentration ($N_A = 10^{17} - 10^{18}$ cm$^{-3}$), which is doped more heavily than the p$^-$-type substrate, is introduced into the p$^-$-doped layer 6 enclosed by the n-doped well 3, 5 (FIG. 1c).

Figure 1D:
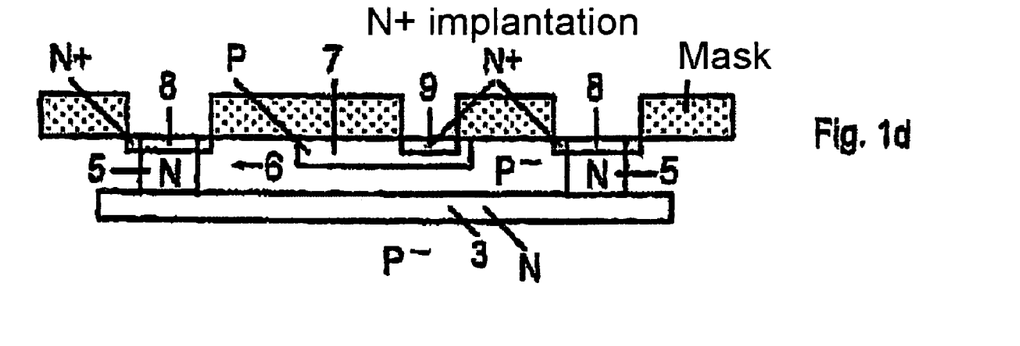

Afterward, by means of ion implantation, a circumferential n$^+$-type transition zone 8 near the surface, with a customary doping concentration ($N_D = 10^{22}$ cm$^{-3}$), is introduced into the edge zone of the well 3, 5 and an n$^+$-doped layer 9 near the surface ($N_D = 10^{22}$ cm$^{-3}$) is introduced into the p-doped layer 7 (FIG. 1d).

Figure 1E:
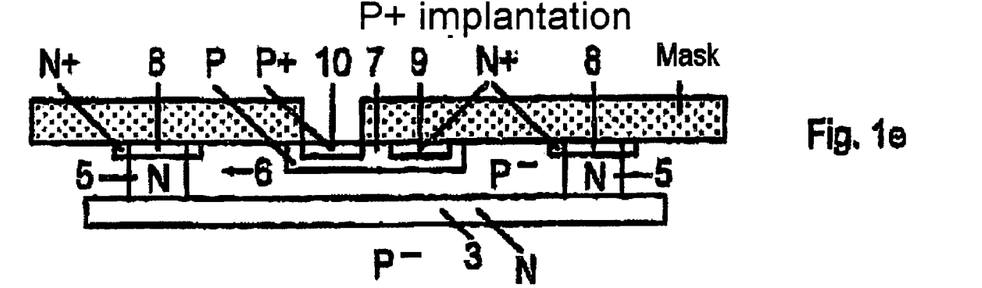

In a further implantation step, a p$^+$-doped transition zone 10 near the surface ($N_D = 10^{22}$ cm$^{-3}$) is then introduced into the p-doped inner layer 7 (FIG. 1e).

Figure 1F:
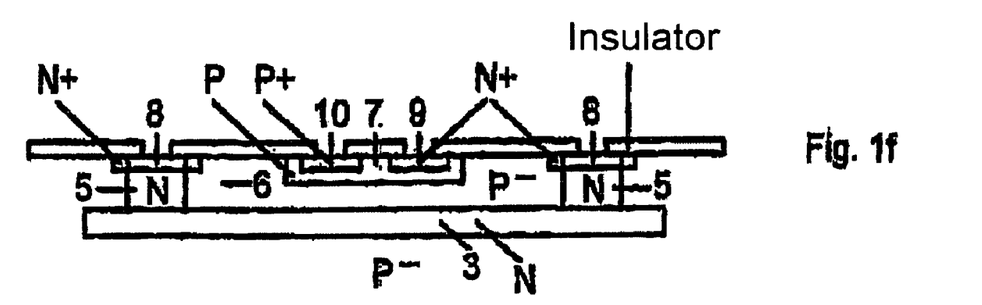

This is followed by constructing the insulation layer (insulator) (FIG. 1f) and performing the contact connection (metal)

of the transistor terminals at the n$^+$-type and p$^+$-type transition zones according to the known methods (see above: G. R. Wilson).

In the NPN transistor, in the p-type substrate, the n-doped well 3, 5 forms the collector K, the p-doped inner layer 7 together with the p$^+$-type transition zone 10 and the p$^-$-doped layer 6 forms the base B, and the n$^+$ doped layer 9 forms the emitter E of the NPN transistor.

Figure 1G:
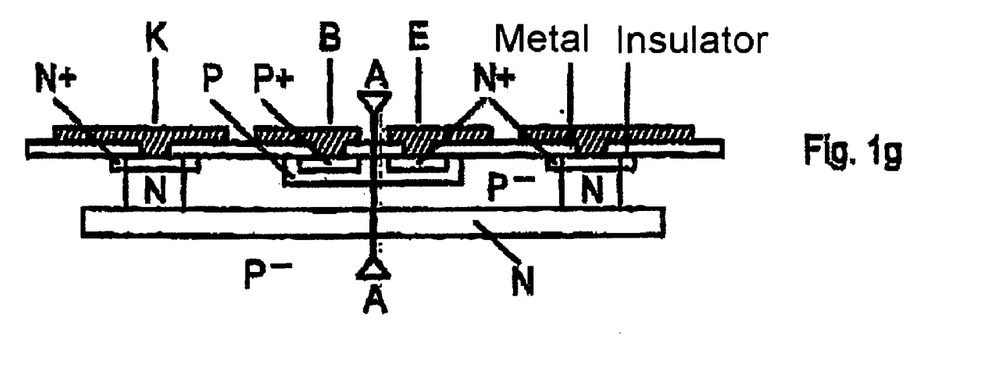
Figure 2:
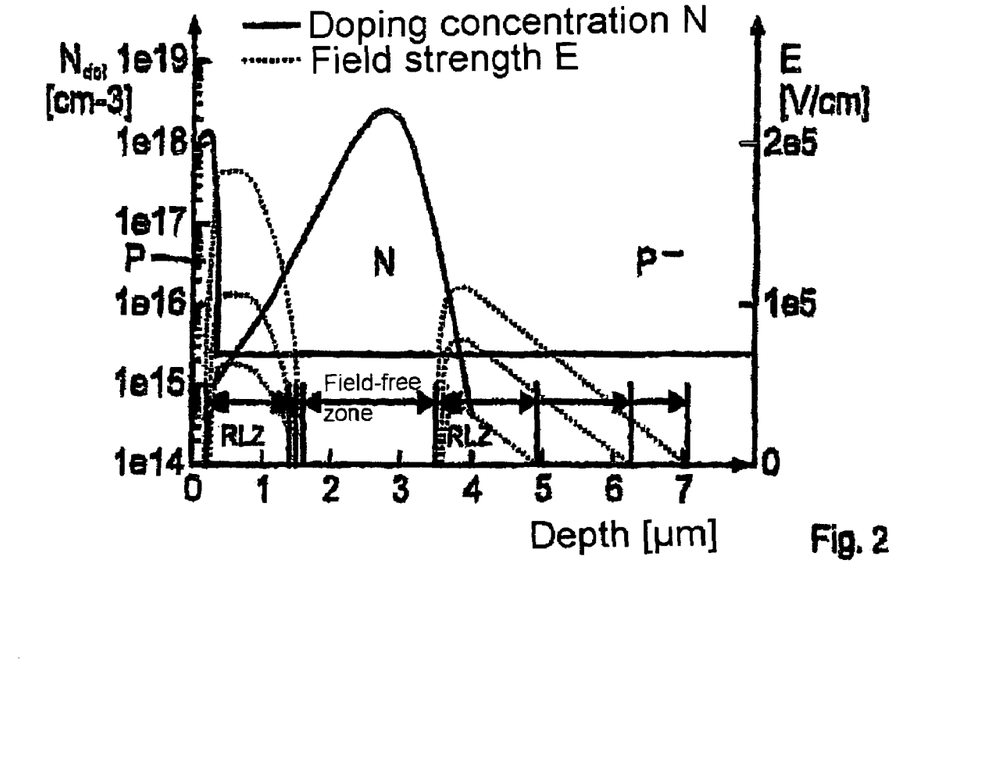
FIG. 2 shows the doping concentration N and field strength E in the semiconductor substrate as a function of the depth along the line A-A from FIG. 1g, a high doping concentration being assumed for the collector.

FIG. 2 shows the doping concentration N and the field strength E as a function of the depth along the line A-A from FIG. 1g assuming that the doping concentration of the n-doped well 3 corresponds to a relatively high concentration according to the prior art.

In order to illustrate the relationship between doping concentration and collector-emitter reverse voltage $U_{CE0}$, it is assumed that the NPN transistor is not driven and no base current flows, that is to say that the emitter E is at the same potential as the substrate (ground) and the collector K is at positive potential. Under this assumption, space charge zones RLZ 1 and RLZ 2 are established at the inner and outer pn junction of the collector. If the collector-emitter voltage UCE exceeds the collector-emitter reverse voltage $U_{CE0}$, then the collector-emitter path breaks down. Reliable operation of the transistor is no longer ensured at higher voltages. It is only under certain conditions that the transistor, with a low-resistance base drive, can also be utilized for switching operation with small collector current flows.

FIG. 2 shows the formation of the first space charge zone RLZ 1 between the p-doped layer 7 forming the base B and the n-doped well 3 forming the collector K. A second space charge zone RLZ 2 is formed between the well 3 and the p$^-$-type substrate 1. A field-free zone is preserved in between. FIG. 2 illustrates the field strength E for different potentials at the collector. During operation of the transistor, the space charge zones extend in the vertical direction with increasing potential at the collector. At the doping concentration from the prior art, however, a field-free region always remains between the space charge zones. As the collector potential increases, the field strength increases on both sides of the space charge zone until the critical field strength for the breakdown between collector and emitter is reached.

It has surprisingly been shown that the collector-emitter breakdown voltage $U_{CE0}$, which is related to the collector-base breakdown voltage $U_{CB0}$ (cf. equation (3)), is considerably increased if the area dose of the collector is lowered.

In the method according to the invention, an n-doped well 3, 5 is produced by means of ion implantation in the p-type substrate, said well being configured in such a way that the first and second space charge zones RLZ 1 and 2 which extend during operation of the transistor with decreasing potential at the collector penetrate through the entire depth of the buried n-doped layer 3 before the critical field strength for a breakdown between collector and emitter is reached. In the present exemplary embodiment, the collector implantation dose, which is dependent on the substrate doping, in particular, is from $1.7 \times 10^{12}$ atoms/cm$^{-2}$.

Figure 3:
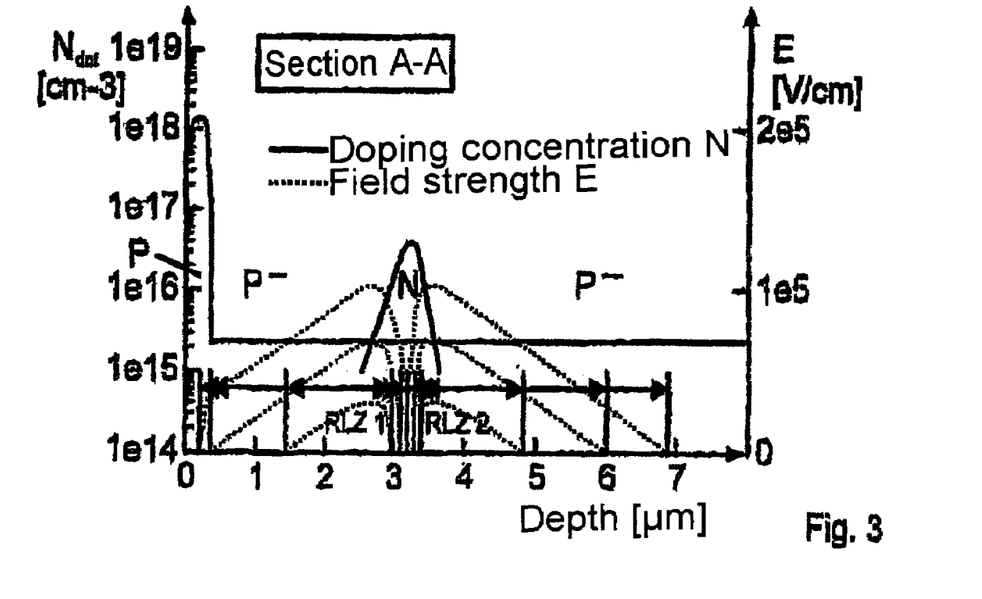
FIG. 3 shows the doping concentration N and the field strength E as a function of the depth along the line A-A from FIG. 1g with the doping profile according to the invention for the collector.

FIG. 3 shows that as the potential at the collector increases and the field strength rises, the space charge zones run toward one another and finally meet. It is crucial that the space charge zones meet before the critical field strength for the collector-emitter breakdown is reached. The collector, which lies below the base as seen spatially, is then fully depleted, that is to say that the maximum available space charge of the collector is thus exhausted. This means that the space charge zones cannot extend any further. Consequently, the field strength in the collector-base depletion layer cannot rise any further either. The charge carrier multiplication remains below the critical threshold. Consequently, not only the $U_{CE0}$ breakdown but also the (vertical) $U_{CB0}$ breakdown is suppressed. This required full depletion defines a lower limit of the collector dose.

The voltage at the collector terminal is permitted to be increased further as long as an avalanche breakdown does not occur between collector terminal and substrate. However, this presupposes adequate precautions against lateral breakdowns with respect to the base and with respect to the substrate.

The fully depleted collector in the turned-off transistor has very high resistance, but as soon as the transistor turns on, the collector potential approximates to the emitter potential and the collector acquires its conductivity again.

If the transistor is intended to be used for arbitrary voltages at the emitter, the differential voltage between base and substrate is increased. The base nevertheless remains insulated from the substrate. In order to achieve the fault depletion, the collector must have a potential raised in the middle relative to the substrate and the base. This forms a sufficient barrier for the holes in the base in order to prevent the holes from flowing away into the substrate. It is only if the collector doping is so weak that the space charge zone between collector and substrate penetrates through the collector zone that a so-called punch-through breakdown takes place. In this case, the holes pass from the base into the substrate. This breakdown possibility defines a lower limit of the collector dose.

In order to obtain a low-resistance collector, the collector dose should be as close as possible to the upper limit.

Both limits of the collector dose principally depend on the substrate doping and lie between $5 \times 10^{11}$ atoms/cm$^{-2}$ and $5 \times 10^{12}$ atoms/cm$^{-2}$. The upper limit of the substrate doping for voltage-stable transistors is given by the avalanche breakdown between collector and substrate. The corresponding breakdown voltage falls as the wafer resistance decreases. A still expedient upper limit of the substrate doping is at a wafer resistance of approximately 0.6 Ωcm. There is no fundamental limit toward lower substrate dopings, but the permissible collector dose and hence the collector conductivity that can be obtained decrease since the well is increasingly depleted only from the base. Further influencing variables on the permissible collector dose are the implantation depth, the desired punch-through strength between base and substrate, the base depth and the thickness of the collector doping. They also determine the tolerance variation of the permissible dose range, which is all the larger, the greater the collector depth, the thinner the collector well and the smaller the maximum voltage difference between base and substrate. With small tolerance variations for the collector doping, it may be necessary to adapt the dose of the fluctuations of the substrate doping.

It has been shown in experiments that in the present exemplary embodiment, the $U_{CE0}$ voltage changes only little given a dose of between $2 \times 10^{13}$ atoms/cm$^{-2}$ and $2 \times 10^{12}$ atoms/cm$^{-2}$. If the dose is lowered only by 15%, however, starting from $2 \times 10^{12}$ atoms/cm$^2$, then $U_{CE0}$ rises by a factor of 4 or more. There is a very sharp transition, therefore, starting from which the fault depletion suppresses the two breakdowns. From there only the avalanche breakdown between well terminal and substrate and the punch-through breakdown between base and substrate determine the maximum operating voltage. By way of example $U_{CE0}$ amounts to 26 V at a dose of $2 \times 10^{13}$ atoms/cm$^{-2}$, 30 V at $2 \times 10^{12}$ atoms/cm$^{-2}$ and more than 120 V at $1.7 \times 10^{12}$ atoms/cm$^{-2}$.

In the production of the NPN bipolar transistor by the method according to the invention, the use of high-voltage ion implantation has proved to be particularly advantageous in order to be able to accurately set the implantation dose to a value that should lie only just below the critical limit.

FIGS. 4a to 4g illustrate the process steps for the production of a PNP bipolar transistor in a p-doped substrate.

Figure 4A:
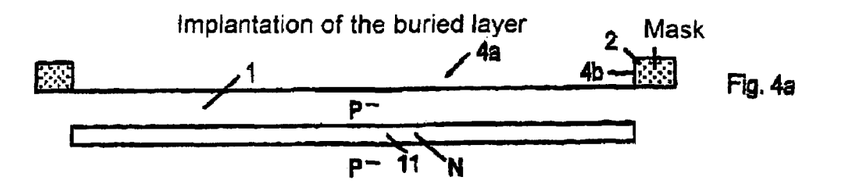
FIGS. 4a-4g show the method steps for the production of a PNP transistor in a p-doped substrate.
Figure 4B:
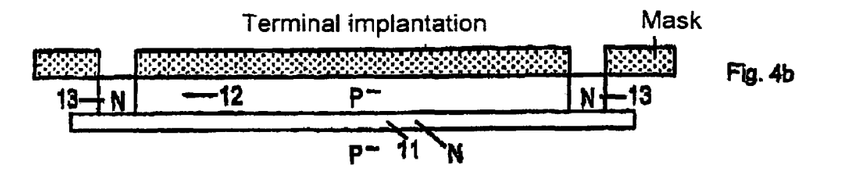
Figure 4C:
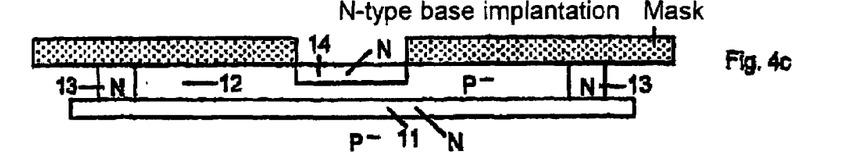
Figure 4D:
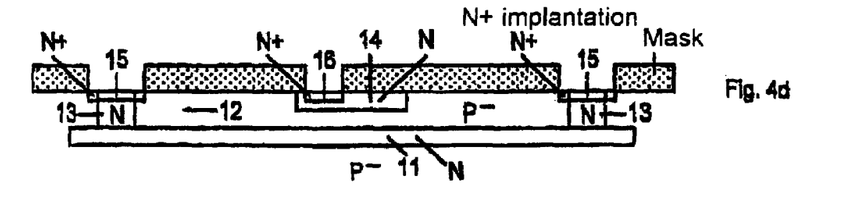
Figure 4E:
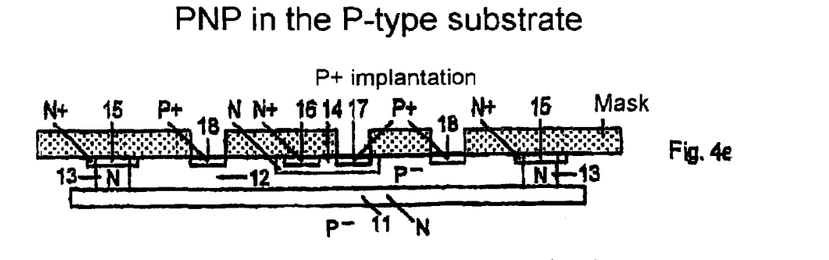

After the mask 2 has been applied to the weakly p-doped substrate 1, once again a buried n-doped layer 11, also referred to as a well, is produced in the weakly p⁻-doped substrate 1 by means of high-voltage ion implantation (FIGS. 4a and 4b). The high-voltage implantation is to be dimensioned such that the substrate conduction type is either maintained at the wafer surface or is re-established by an additional doping. Analogously to FIG. 1a, the well is laterally isolated and connected for example by means of a further doping 13. The p⁻-doped layer 12 remains in the n-doped well 11, 13. In a further implantation step, a central n-doped layer 14 is introduced into the p⁻-doped layer 12 (FIG. 4c). Afterward, a peripheral n⁺-type transition zone near the surface is introduced in the edge zone 13 of the well 11 and a lateral n⁺-type transition zone 16 near the surface is introduced into the central n-type layer 14 by ion implantation (FIG. 4d). This is then followed by the introduction of a peripheral p⁺-type transition zone 18 near the surface into the p⁻-type layer 12 and a lateral p⁺-type layer 17 near the surface into the central n-type layer 14 by ion implantation (FIG. 4e).

Figure 4F:
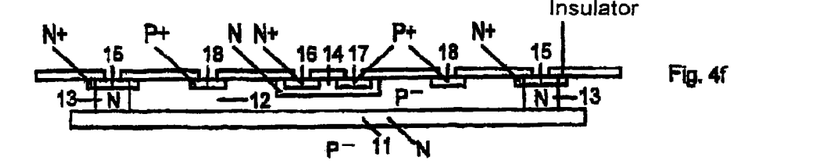
Figure 4G:
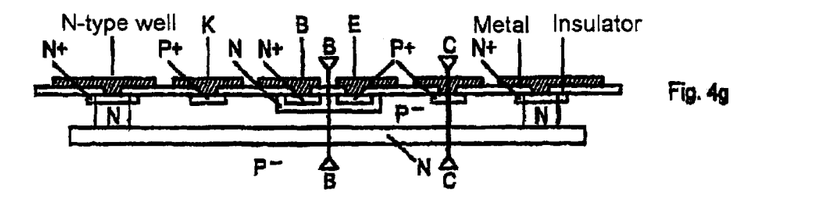

Finally, the insulation (insulator) and the production of the terminals are effected (FIGS. 4f and 4g). The inner p⁻-type layer 12 now forms the collector K, the central n-type layer 14 forms the base B and the lateral p⁺-type layer 17 forms the emitter E of the PNP transistor, the highly doped transition zones being provided for producing an ohmic connection to the transistor terminals.

The contact connection of the transistor terminals may once again be effected by the known processes. In order to suppress the $U_{CE0}$ and $U_{CB0}$ breakdown, it is necessary also in the PNP transistor, in the p-type substrate, for the (p-type) collector below the n-type base to be fully depleted before $U_{CE0}$ is reached. The n-type well, by contrast, must not be depleted at this point, however, since it, for its part, is intended to deplete the (p-type) collector. This yields, in mutual dependence on one another, an upper limit for the (p-type) collector doping and a lower limit for the implantation dose of the n-type well.

Figure 5:
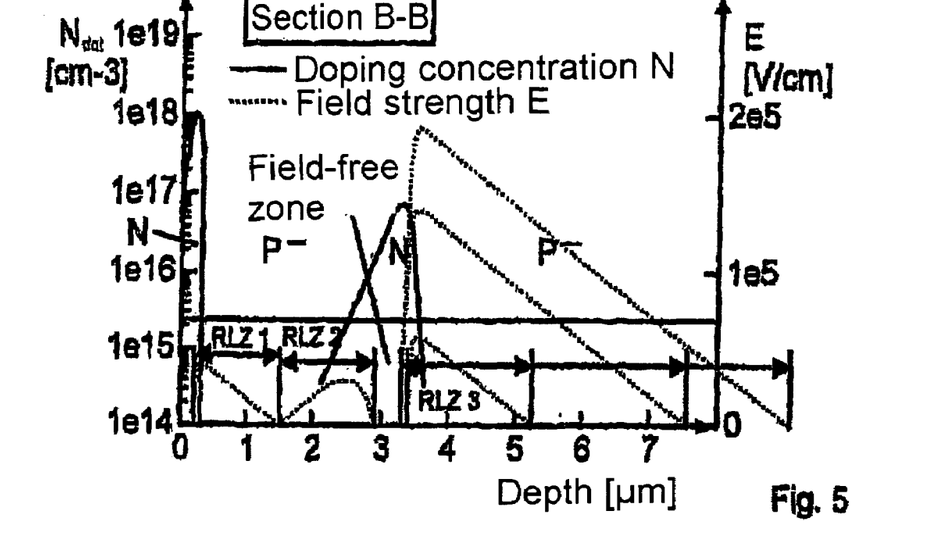
FIG. 5 shows the doping concentration N and the field strength E as a function of the depth along the line B-B from FIG. 4g with the doping profile according to the invention.

FIG. 5 shows the doping concentration N and the field strength E as a function of the depth along the line B-B from FIG. 4g. A first space charge zone RLZ 1 is formed between the n-doped layer 14 and the p⁻-doped layer 12 and a second space charge zone RLZ 2 is formed between the p⁻-doped layer 12 and the buried n-doped layer 11. The two space charge zones extend on both sides during operation of the transistor with decreasing potential at the collector K.

By means of the ion implantation, the buried n-doped layer is produced with a doping profile configured in such a way that the space charge zones RLZ 1 and RLZ 2 which extend during operation of the transistor with decreasing potential at the collector penetrate through the entire depth of the p⁻-doped layer 12 before the critical field strength for a breakdown between collector K and emitter E is reached.

A third space charge zone is formed between the buried n-doped layer 11 and the p⁻-type substrate 1. The reverse voltages are furthermore increased if the doping profile is configured, moreover, in such a way as to preclude the situation in which the second and third space charge zones RLZ 2 and RLZ 3 meet during operation of the transistor.

Exemplary embodiments for the interconnection of the n-type well are specified below.

A parasitic NPN transistor extends from the n-type base via the p-type collector to the n-type well. Owing to the required full depletion of the p-type collector, with respect to which the n-type well has a considerable proportion, on the one hand the base of said NPN transistor is comparatively weakly doped and the emitter of the NPN transistor is comparatively highly doped. The consequence is a high current gain and a low collector-emitter punch-through breakdown voltage. Therefore, the differential voltage between the n-type well and the n-type base of the PNP transistor must be kept low. A further reason for this is also the desired reverse voltage between p-type collector and n-type well, owing to the intended depletion of the p-type collector (from below). In order to avoid the n-type well as fourth terminal of the transistor requiring a separate interconnection, the following two possibilities are appropriate:

The n-type well is connected to the emitter. The voltage difference between the n-type base and the n-type well is restricted to a diode forward voltage of approximately 0.7 V. One advantage of this configuration is that the n-type well is always—even in the saturation case of the transistor—at a higher potential than the collector and the substrate PNP (collector terminal—n-type well—substrate) thus always remains turned off, as a result of which an undesired substrate current is avoided.

However, the n-type well may also be connected to the base. The parasitic NPN transistor (n-type base/p-type collector/n-type well) is thereby deactivated because its collector-emitter path is short-circuited. The PNP transistor can thereby be operated at higher collector currents than with a connection between n-type well and emitter. This is because in the latter case the parasitic NPN, in the (quasi-)saturation case, short-circuits the base-emitter junction of the main PNP transistor and thus leads to a premature drop in the current gain. This disadvantage is avoided with the n-type well at the base, but is bought at the expense of a substrate current in the (quasi-)saturation case.

The relationship between the collector doping and the collector-base and collector-emitter reverse voltage is explained in more detail below.

Since the (p-type) collector is situated within the n-type well or above the concentration maximum of the well profile, that is to say lies less deeply below the base than in the case of the NPN transistor, in the case of a highly doped collector this would result in a smaller $U_{CE0}$ than in the case of the NPN transistor with a highly doped collector (n-type well), it being assumed that the same implantation depth or energy is used for NPN and PNP transistors. Consequently, the (p-type) collector must already be fully depleted at lower (negative) collector voltages relative to the base, so that this results in an upper limit for the (p-type) collector doping and thus for the collector conductivity. Full depletion at lower collector voltages initially means that the maximum permitted (p-type) collector dose is rather lower than in the case of the NPN transistor. However, since the p-type collector is depleted not only from above through the n-type base, but also from below through the n-type well that is more highly doped relative to the p-type collector, the disadvantage of the smaller $U_{CE0}$ is at least partly compensated for.

It should be noted that the n-type well performs the same function for the PNP transistor as the substrate does for the NPN transistor. The difference, however, is that in the case of the PNP transistor, the collector volume doping concentration is lower than that of the underlying n-type well. In the case of the NPN transistor, by contrast, the collector volume doping concentration is higher than that of the underlying substrate. Consequently, in the case of the PNP transistor the space charge zone below the collector has a higher collector penetration capability than in the case of the NPN for the same applied voltage.

In order to be able to operate the PNP transistor at supply voltages above the avalanche breakdown voltage between p-type collector terminal and n-type well, the n-type well must be fully depleted in this region before the avalanche breakdown commences. The doping profile and the field strength profile correspond to the NPN transistor in the region of the p-type base. The difference, however, is that the full depletion must commence only at a significantly higher voltage corresponding to $U_{CB0}$ in the case of the NPN transistor. The upper limit resulting from this for the implantation dose of the n-type well is thus higher than in the case of the NPN transistor.

Figure 6:
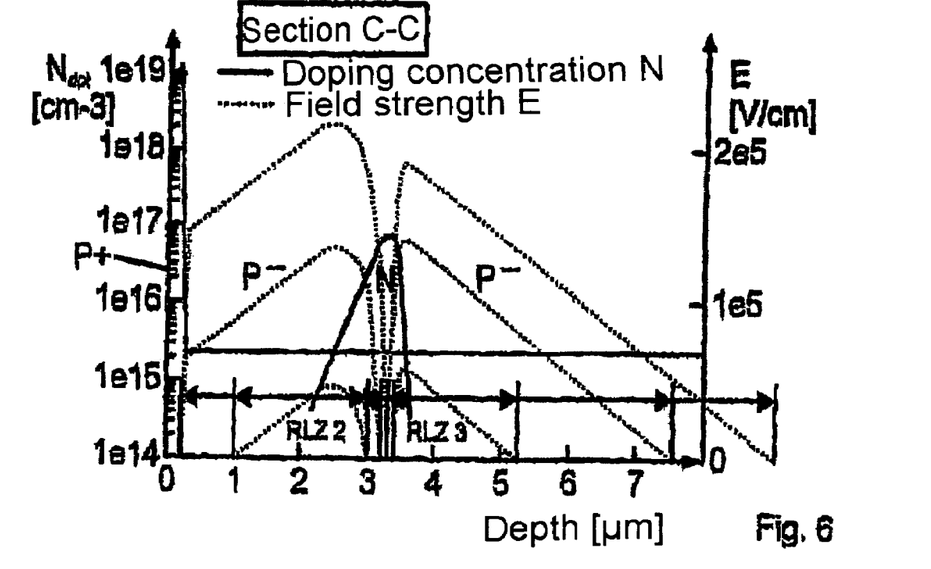
FIG. 6 shows the doping concentration N and the field strength E as a function of the depth along the line C-C from FIG. 4g, FIGS. 7a-7g show the method steps for the production of a PNP transistor in an n-doped substrate.
Figure 7A:
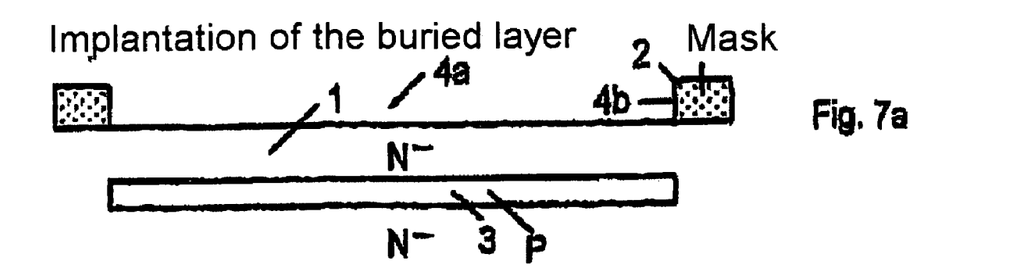
Figure 7B:
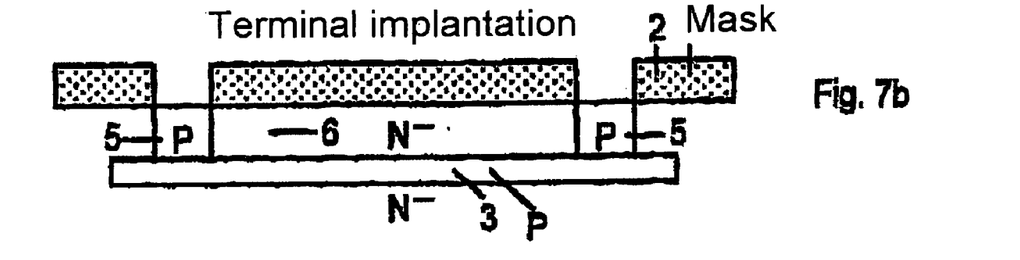
Figure 7C:
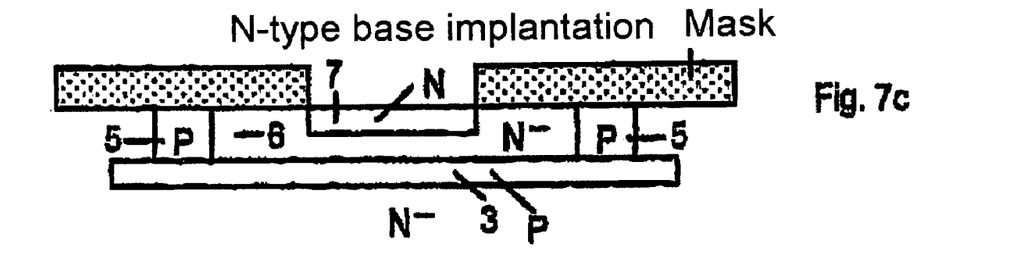
Figure 7D:
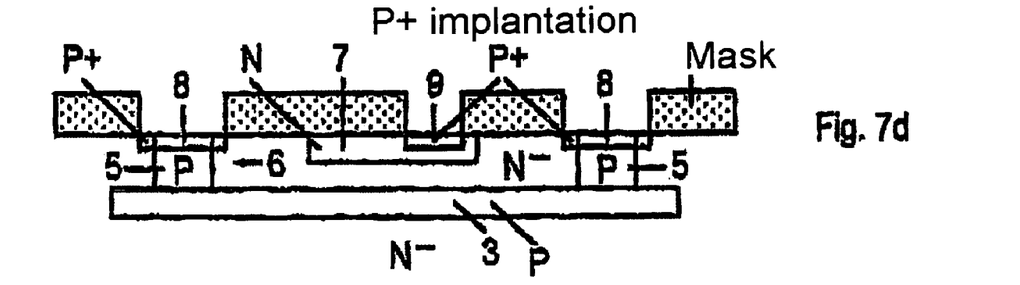
Figure 7E:
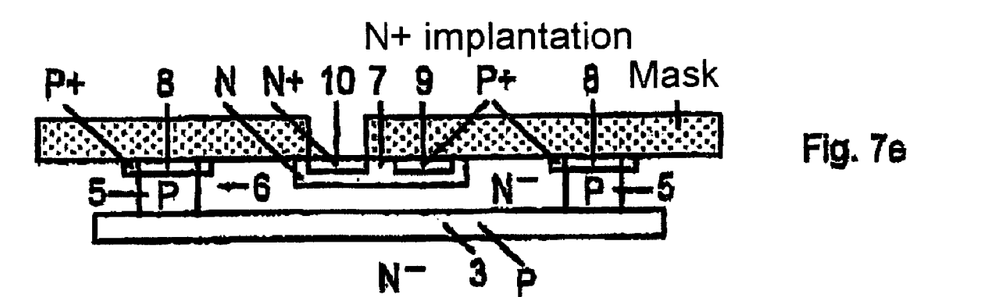
Figure 7F:
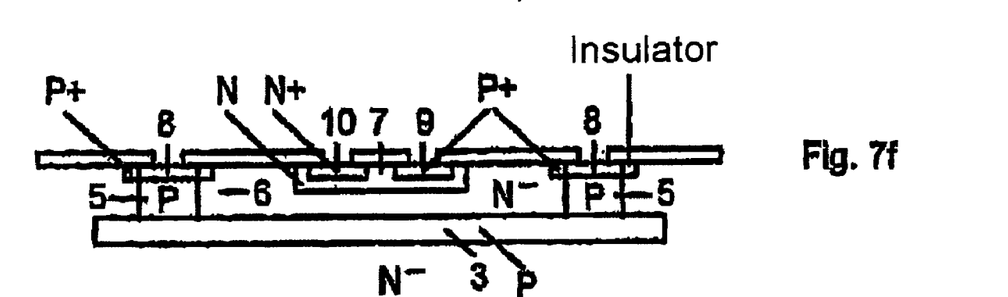
Figure 7G:
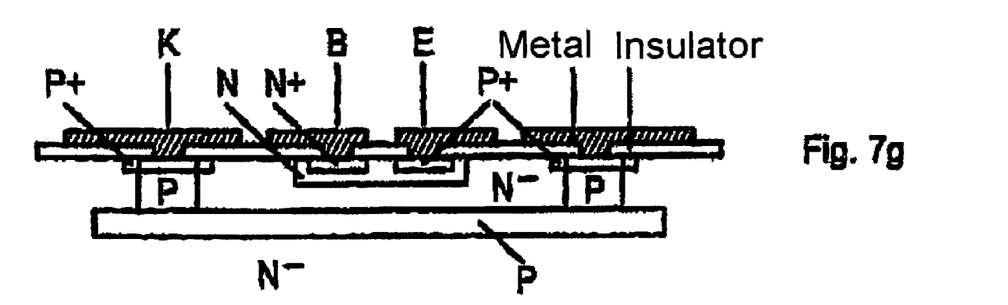
Figure 8A:
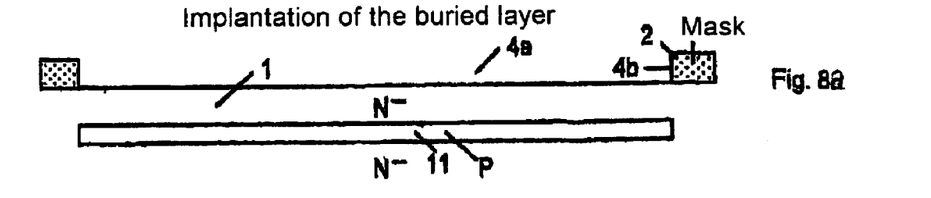
FIGS. 8a-8g show the method steps for the production of an NPN transistor in an n-doped substrate.
Figure 8B:
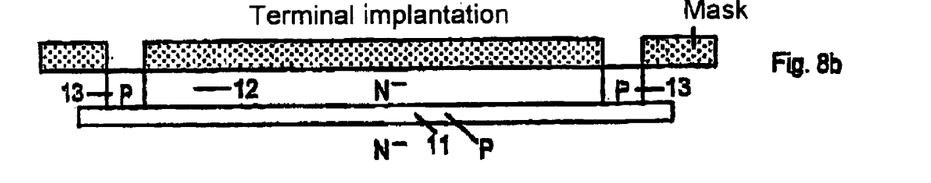
Figure 8C:
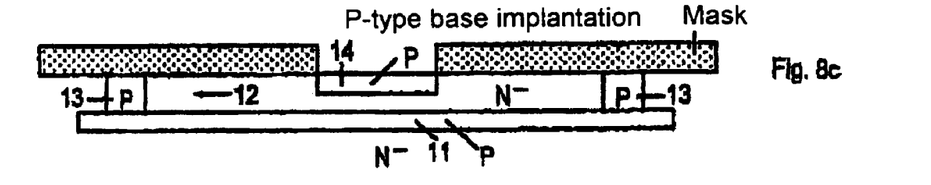
Figure 8D:
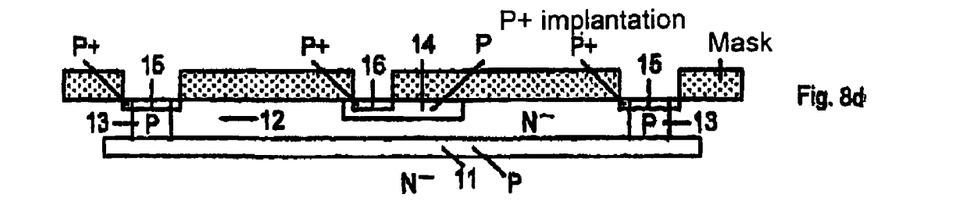
Figure 8E:
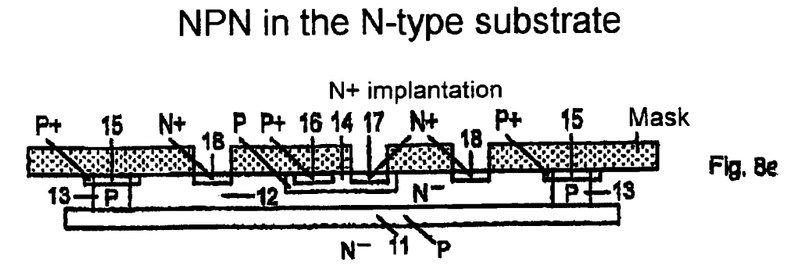
Figure 8F:
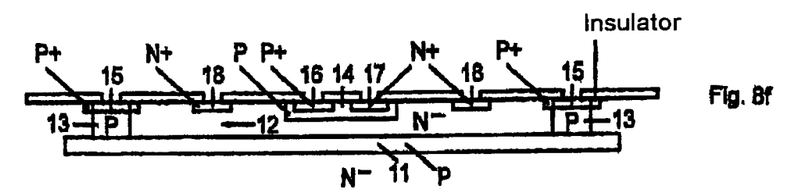
Figure 8G:
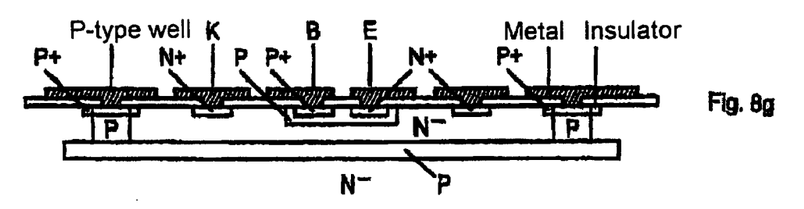

FIG. 6 shows the doping concentration N and the field strength E as a function of the depth along the line C-C from FIG. 4g. This sectional plane does not include the n-doped zone 14. The second and third space charge zones RLZ 2 and RLZ 3 once again penetrate through the n-type well 11 during operation of the transistor with decreasing collector potential. Since the substrate is connected to the negative potential within the circuit in which the transistor is used, it is always at the collector potential or more negative. The potential of the n-type well, however, is at or at least close to the base potential. Consequently, it can be assumed that the reverse voltage at the third space charge zone RLZ 3 has a value at least as great as that at the second space charge zone RLZ 2. As soon as the two space charge zones meet as the collector potential decreases, the field strength cannot rise any further in them, as described with reference to FIG. 3. If the doping concentration is chosen to be sufficiently low such that the space charge zones meet before the critical field strength for a breakdown between the collector terminal and the n-type well is reached, then this breakdown is suppressed.

The reverse voltages are increased even further if, in this sectional plane, too, a doping concentration is given which is configured in such a way that the second and third space charge zones meet during operation of the transistor with decreasing collector potential before the critical field strength for a breakdown between collector terminal and n-type well is reached.

Since the p-type collector can generally assume arbitrary potentials between ground and supply voltage, the punch-through breakdown of the substrate PNP transistor (collector terminal—n-type well—substrate) must be avoided—analogously to the NPN transistor. This results in a further lower limit for the implantation dose of the n-type well.

FIGS. 7a to 7g show the method steps for the production of a PNP transistor in the n-type substrate. The individual method steps correspond to the steps of Figs. 1a to 1g, which illustrate the production process for the NPN transistor in the p-type substrate. The PNP transistor in the n-type substrate differs from the NPN transistor in the p-type substrate in its construction only by the fact that all the p-type dopings are replaced by n-type dopings and all the n-type dopings are replaced by p-type dopings. The method steps are otherwise identical. The mutually corresponding layers are therefore also provided with the same reference symbols. The same relationships hold true between the magnitude of the reverse voltages and the doping concentration.

FIGS. 8a to 8g show the method steps for the production of an NPN transistor in the n-type substrate. The individual process steps again correspond to the method steps for the production of the PNP transistor in the p-type substrate illustrated in FIGS. 4a to 4g. In this case, too, once again all the p-type dopings are replaced by n-type dopings and all the n-type dopings are replaced by p-type dopings. The mutually corresponding layers are therefore likewise provided with the same reference symbols. The same relationships also again hold true between the magnitude of the reverse voltages and the doping concentration.

The complementary process using a weakly n-doped substrate is an advantageous embodiment insofar as a p-type well replaces the n-type well. If the p-type well is produced by means of a boron ion implantation, the same well depth can be achieved with significantly smaller ion energies or deeper wells can be produced with the same ion energy.

The invention claimed is:

1. A method for the production of an NPN bipolar transistor in a p-doped semiconductor substrate comprising the following steps:

production of a buried n-doped layer forming the collector,
production of a p-doped layer arranged above the buried n-doped layer and forming the base, and of an n-doped layer arranged within the p-doped layer and forming the emitter, so that a first space charge zone is formed between the p-doped layer and the buried n-doped layer and a second space charge zone is formed between the buried n-doped layer and the p-type substrate, which extend in the vertical direction during operation of the transistor with increasing potential at the collector,
characterized in that a buried n-doped layer is produced with a doping profile configured in such a way that the first and second space charge zones which extend during operation of the transistor with increasing potential at the collector penetrate through the entire depth of the buried n-doped layer before the critical field strength for a breakdown between collector and emitter is reached.

2. The method as claimed in claim 1, characterized in that a mask is applied to the p-type substrate for the definition of a window delimited by a circumferential edge and the buried n-doped layer is produced by means of ion implantation through the mask.

3. An NPN bipolar transistor comprising
a p-doped substrate,
a buried n-doped layer, which forms the collector,
a p-doped layer arranged above the buried n-doped layer and forming the base, and
an n-doped layer arranged within the p-doped layer and forming the emitter,
a first space charge zone being formed between the p-doped layer and the buried n-doped layer and a second space charge zone being formed between the buried n-doped layer and the p-type substrate, which extend in the vertical direction during operation of the transistor with increasing potential at the collector,
characterized in that the buried n-doped layer has a doping profile configured in such a way that the first and second space charge zones which extend during operation of the transistor with increasing potential at the collector penetrate through the entire depth of the buried n-doped layer before the critical field strength for a breakdown between collector and emitter is reached.

* * * * *

UNITED STATES PATENT AND TRADEMARK OFFICE
CERTIFICATE OF CORRECTION

PATENT NO. : 7,563,685 B2
APPLICATION NO. : 11/547532
DATED : July 21, 2009
INVENTOR(S) : Hartmut Grützediek, Michael Rammensee and Joachim Scheerer

Page 1 of 1

It is certified that error appears in the above-identified patent and that said Letters Patent is hereby corrected as shown below:

Title Page, item (86) §371(c)(1), (2), (4) Date:, delete "Sept. 29, 2006" and insert --February 20, 2007--

Signed and Sealed this

Twenty-second Day of September, 2009

David J. Kappos
*Director of the United States Patent and Trademark Office*